United States Patent
Lee (10) Patent No.: US 10,566,334 B2
(45) Date of Patent: Feb. 18, 2020

(54) METHODS USED IN FORMING INTEGRATED CIRCUITRY INCLUDING FORMING FIRST, SECOND, AND THIRD CONTACT OPENINGS

(71) Applicant: Micron Technology, Inc., Boise, ID (US)

(72) Inventor: Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/977,622

(22) Filed: May 11, 2018

(65) Prior Publication Data
US 2019/0348421 A1 Nov. 14, 2019

(51) Int. Cl.
*H01L 27/108* (2006.01)
*H01L 21/768* (2006.01)
*H01L 23/522* (2006.01)

(52) U.S. Cl.
CPC .. *H01L 27/10891* (2013.01); *H01L 21/76802* (2013.01); *H01L 21/76877* (2013.01); *H01L 23/5226* (2013.01)

(58) Field of Classification Search
None
See application file for complete search history.

(56) References Cited

U.S. PATENT DOCUMENTS

| 5,334,548 | A | 8/1994 | Shen et al. | |
|---|---|---|---|---|
| 5,956,594 | A | 9/1999 | Yang et al. | |
| 6,143,604 | A | 11/2000 | Chiang et al. | |
| 6,258,649 | B1 * | 7/2001 | Nakamura | H01L 27/10894 438/238 |
| 6,383,868 | B1 * | 5/2002 | Parekh | H01L 27/10894 257/E21.013 |
| 7,453,112 | B2 * | 11/2008 | Paterson | H01L 27/10864 257/296 |
| 7,456,439 | B1 * | 11/2008 | Horch | G11C 11/39 257/133 |
| 9,269,828 | B2 * | 2/2016 | Iwase | H01L 27/115 |

FOREIGN PATENT DOCUMENTS

| JP | 10-256505 | 9/1998 |
|---|---|---|
| JP | 2002-270797 | 9/2002 |
| WO | WO PCT/US2019/016824 | 5/2019 |

\* cited by examiner

*Primary Examiner* — Bilkis Jahan
(74) *Attorney, Agent, or Firm* — Wells St. John P.S.

(57) ABSTRACT

Integrated circuitry comprises a first conductive line buried within semiconductive material of a substrate. The first conductive line comprises conductively-doped semiconductor material directly above and directly against metal material in a vertical cross-section. A second conductive line is above the semiconductive material and is laterally-spaced from the first conductive line in the vertical cross-section. The second conductive line comprises metal material in the vertical cross-section. Insulative material is directly above the first and second conductive lines. A first conductive via extends through the insulative material and through the conductively-doped semiconductor material to the metal material of the first conductive line. A second conductive via extends through the insulative material to the metal material of the second conductive line. Other embodiments and aspects, including method, are disclosed.

23 Claims, 10 Drawing Sheets

METHODS USED IN FORMING INTEGRATED CIRCUITRY INCLUDING FORMING FIRST, SECOND, AND THIRD CONTACT OPENINGS

TECHNICAL FIELD

Embodiments disclosed herein pertain to integrated circuitry, to DRAM circuitry, and to methods used in forming integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bit lines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

DETAILED DESCRIPTION OF EXAMPLE EMBODIMENTS

Embodiments of the invention encompass methods used in forming integrated circuitry, for example DRAM circuitry. Example embodiments are described with reference to FIGS. 1-11.

Figure 1:
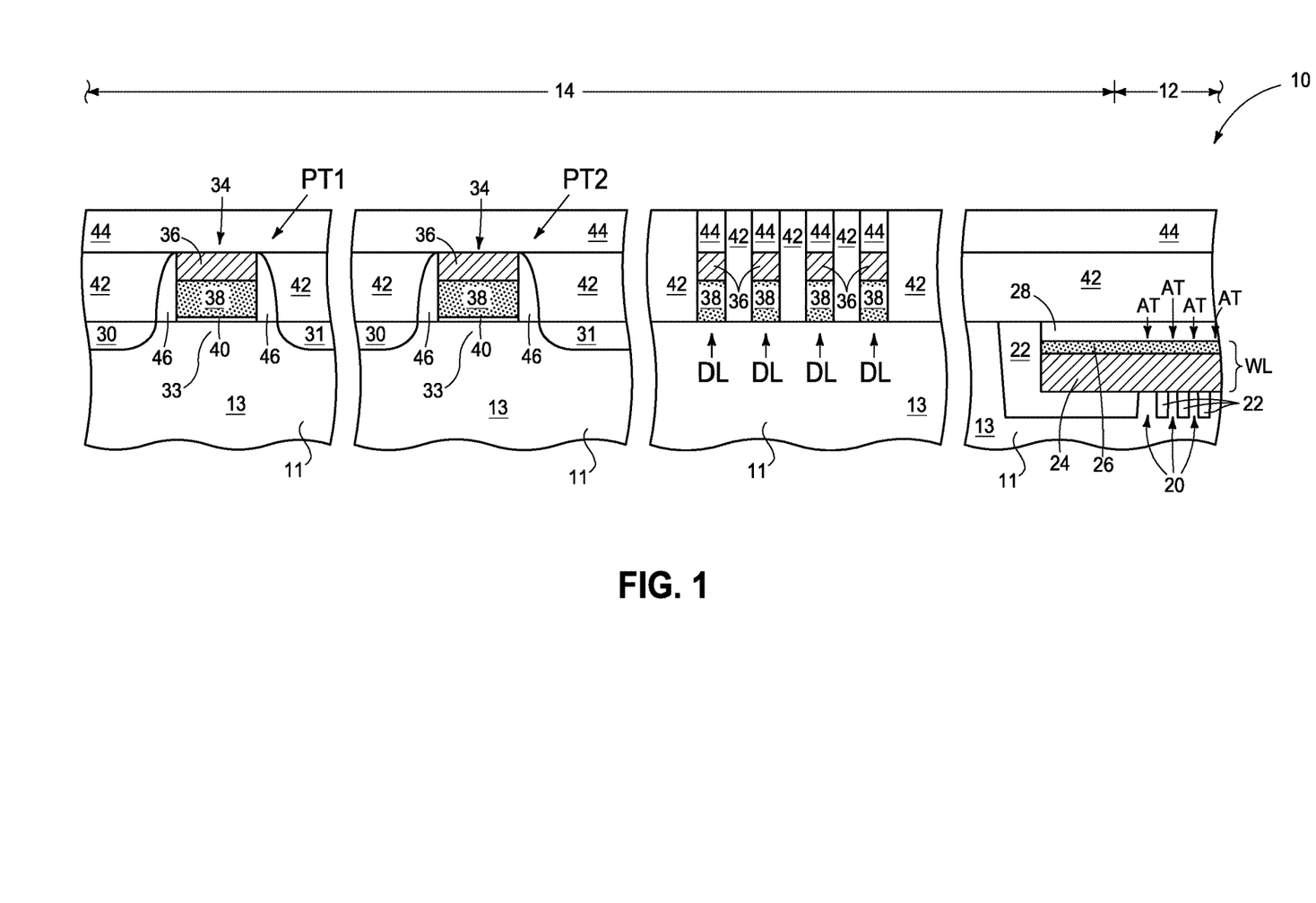
FIG. 1 is a diagrammatic and fragmentary cross-sectional view of a portion of a substrate construction in process in accordance with an embodiment of the invention.

FIG. 1 shows a substrate construction 10 in process of a method of forming DRAM. An example base substrate 11 of construction 10 may include any one or more of conductive/conductor/conducting (i.e., electrically herein), semiconductive/semiconductor/semiconducting, or insulative/insulator/insulating (i.e., electrically herein) materials. Various materials have been formed above base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within an array (e.g., a memory array) may also be fabricated and may or may not be wholly or partially within an array or sub-array. Further, multiple sub-arrays may be fabricated and operated independently, in tandem, or otherwise relative one another. In this document, a "sub-array" may also be considered as an array. Example base substrate 11 comprises semiconductive material 13 (e.g., suitably and variously doped monocrystalline silicon). Substrate 10 comprises an array region 12 and a peripheral-circuitry region 14 adjacent array region 12.

Figure 2:
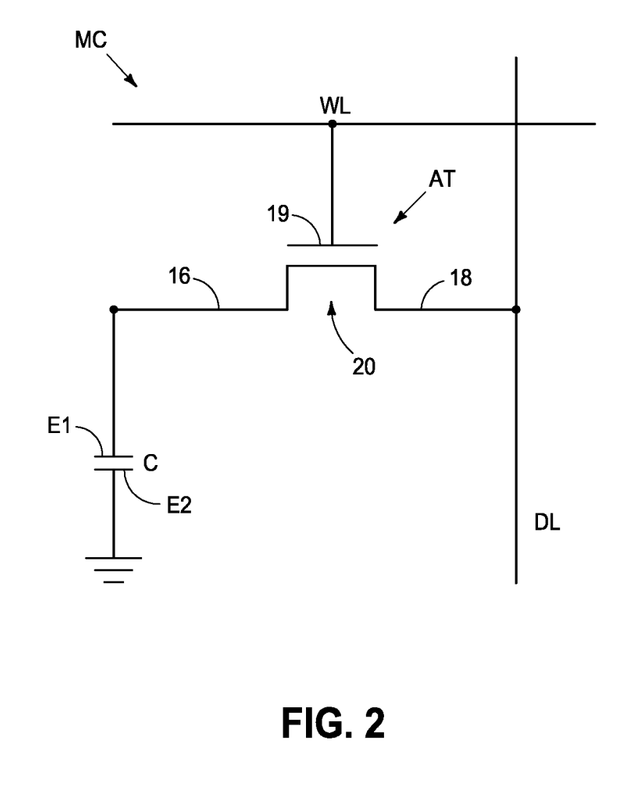
FIG. 2 is a diagrammatic schematic of a memory cell in accordance with an embodiment of the invention.

Referring to FIGS. 1 and 2, array region 12 comprises memory cells MC (FIG. 2) individually comprising an array transistor AT (i.e., a transistor within an array region) having a pair of source/drain regions 16, 18 and a gate 19 directly electrically coupled to and thereby comprising a wordline WL. Example wordline WL is shown buried within semiconductive material 13 of substrate 10. Memory cell MC comprises a capacitor C having one of its electrodes (e.g., E1) directly electrically coupled to one of source/drain regions 16, 18 (16 as shown). Another capacitor electrode (e.g., E2) opposing the one capacitor electrode may be a common capacitor electrode among all capacitors in the array and may be directly electrically coupled to ground, as shown, or to some other suitable potential. The other of source/drain regions 16, 18 (18 as shown) is directly electrically coupled to a digitline DL. Digitlines DL would likely be angled (i.e., other than the straight angle) relative to the orientation of wordlines WL, for example at 90° as shown. Capacitor C of FIG. 2 would directly electrically couple with source/drain region 16 that would positionally be one of into or out of the plane-of-the-page upon which FIG. 1 lies and be above base substrate 11. Other source/drain region 18 would positionally be in the other of into or out of the plane of the FIG. 1 page and directly electrically couple to a digitline DL that may be above or below capacitor C.

Transistors AT individually comprise a channel region 20 that extends aside both sides of (not visible in FIG. 1) and below wordline WL/gate 19, with a gate insulator (not shown) being between wordline WL/gate 19 and channel region 20. Example insulative material 22 (e.g., shallow trench isolation comprising silicon dioxide and/or silicon nitride) is shown separating array transistors AT. Example wordline WL comprises conductively-doped (e.g., having a maximum dopant concentration of at least $10^{19}$ atoms/cm$^3$) semiconductor material 26 (e.g., conductively-doped polysilicon and/or other conductively-doped semiconductor material) directly above and directly against metal material 24 (e.g., elemental tungsten and/or titanium nitride). Insulative material 28 (e.g., silicon nitride) is directly above and directly against wordline WL.

Peripheral-circuitry region 14 comprises a peripheral transistor (i.e., a transistor in a peripheral region), with two example peripheral transistors PT1 and PT2 being shown. Each is shown as comprising a pair of source/drain regions 30, 31 having a channel region 33 there-between. One or both of source/drain regions 30, 31 may comprise conductively-doped elemental-form silicon. Example peripheral gate constructions of PT1 and PT2 are shown as comprising a gate construction 34 comprising conductive material 36 (e.g., metal material such as a metal silicide, elemental tungsten, and/or titanium nitride) directly above and directly against underlying conductive material 38 (e.g., conductively-doped polysilicon and/or other conductively-doped semiconductor material). A gate insulator 40 (e.g., silicon dioxide and/or silicon nitride) is between conductive material 38 and channel region 33.

Wordline WL and digitline DL extend from array region 12 into peripheral-circuitry region 14. Example digitlines DL are shown as comprising conductive material 36 (e.g., metal material) above and directly against conductive material 38 (e.g., conductively-doped poly silicon and/or other conductively-doped semiconductor material). Regardless, insulative material is directly above wordline WL, digitline DL, and peripheral transistor PT1 and/or PT2 in peripheral-circuitry region 14. By way of example only, such is shown as comprising insulative material 28, insulative material 42 (e.g., silicon dioxide), and insulative material 44 (e.g., silicon nitride) above wordline WL in peripheral-circuitry region 14 (and in one embodiment in array region 12). Example insulative material 44 is shown as being directly above digitlines DL and peripheral transistors PT1 and PT2, with example insulative material 42 being between insulative material 44 and base substrate 11. Insulative sidewall spacers 46 (e.g., silicon dioxide and/or silicon nitride) are shown laterally—about materials 36, 38, and 40 with respect to peripheral transistors PT1 and PT2.

Figure 3:
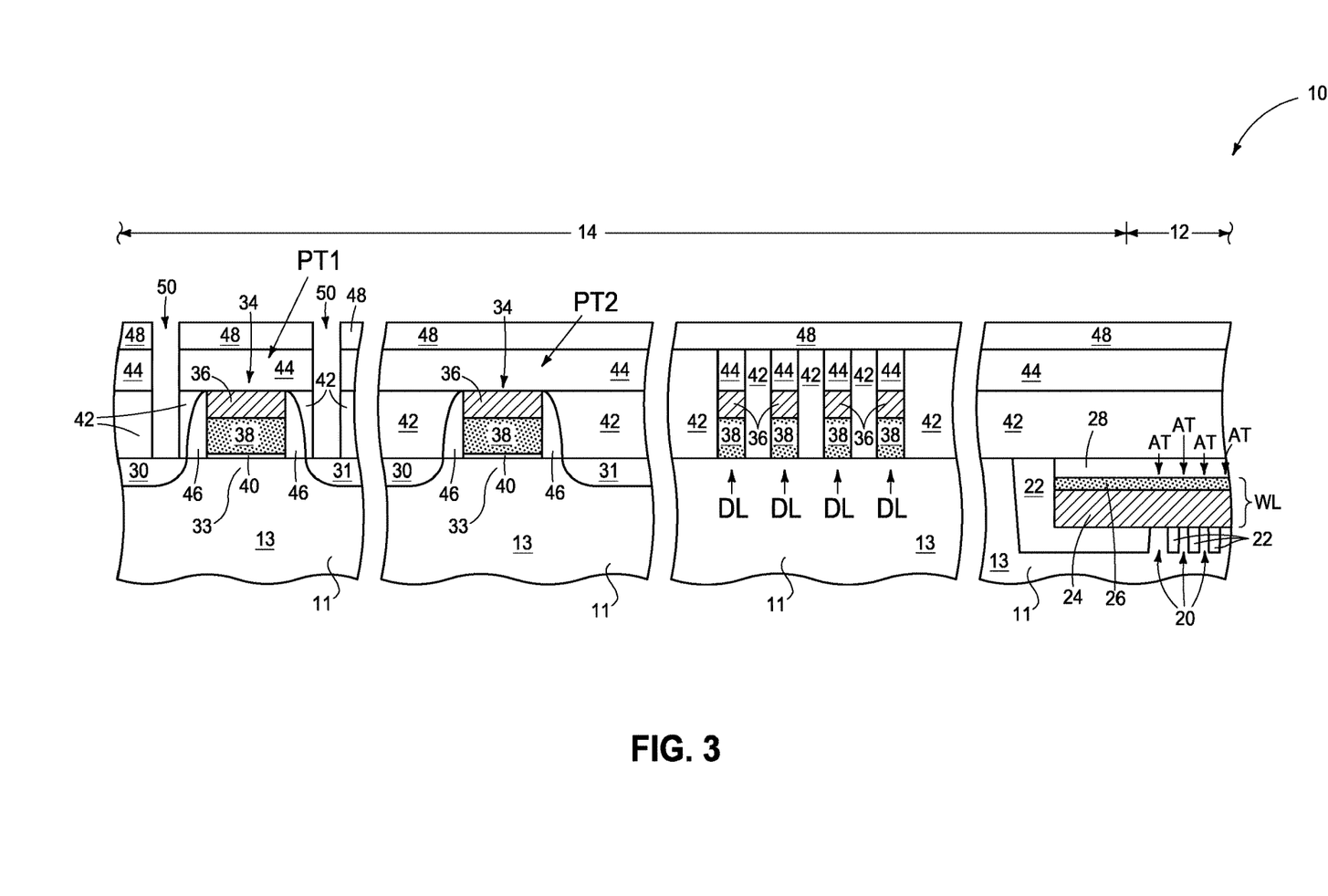
FIG. 3 is a view of the FIG. 1 construction at a processing step after that shown by FIG. 1.

Referring to FIG. 3, a first contact opening 50 (two being shown) has been formed through insulative material 44/42 in peripheral-circuitry region 14 to elemental-form silicon of source/drain region 30 or 31 (to each of source/drain regions 30 and 31 as shown) of peripheral transistor PT1 in a vertical cross-section (e.g., that shown by the plane-of-the-page upon which FIG. 3 lies) while wordline(s) WL and digitline(s) DL are completely covered in peripheral-circuitry region 14 in the vertical cross-section. An example technique includes photolithographic patterning and dry anisotropic etching (with or without pitch multiplication, and/or using hard masking material(s)), for example using a photoimageable material 48 (e.g., photoresist) as shown. Alternately, first contact opening(s) 50 may be formed later as described below. Example anisotropic etching to form first contact opening(s) 50 may be conducted selectively relative to elemental-form silicon of source/drain region 30 or 31 (e.g., using a CH$_2$F$_2$/O$_2$/Ar-mixture to etch Si$_3$N$_4$ and a C$_4$H$_6$/O$_2$/Ar-mixture or a C$_4$H$_8$/O$_2$/Ar-mixture to etch SiO$_2$).

Figure 4:
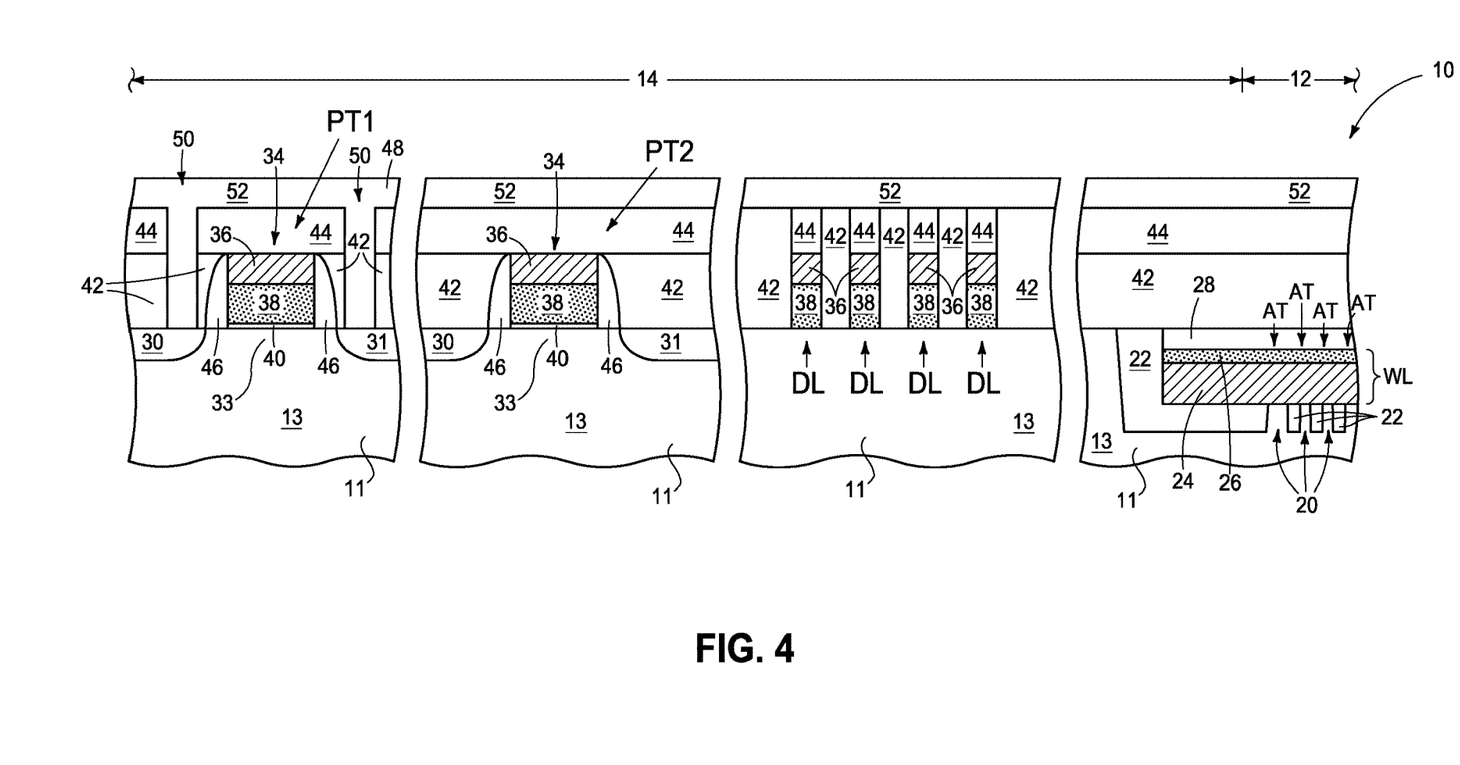
FIG. 4 is a view of the FIG. 3 construction at a processing step after that shown by FIG. 3.

Referring to FIG. 4, and in one embodiment, photoimageable material 48 (not shown) from FIG. 3 has been removed and photoimageable material 52 (e.g., photoresist) has been deposited to fill first contact openings 50.

Figure 5:
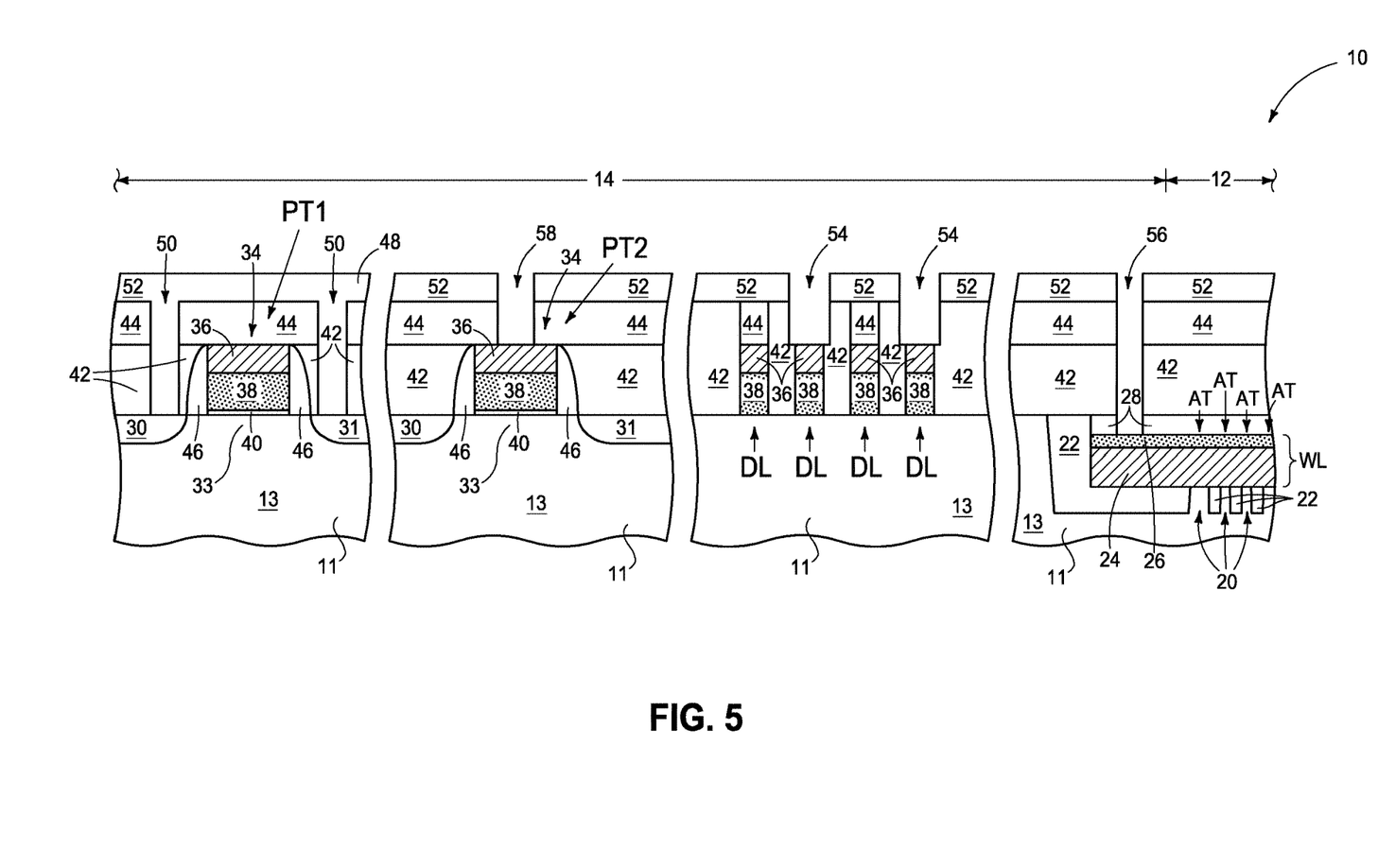
FIG. 5 is a view of the FIG. 4 construction at a processing step after that shown by FIG. 4.

Referring to FIG. 5, a second contact opening 54 (two being shown) has been formed through insulative material 44 in peripheral-circuitry region 14 to conductive material (e.g., metal material 36) of digitline(s) DL in the vertical cross-section. A third contact opening 56 has been formed through insulative material 28/42/44 in peripheral-circuitry region 14 to conductively-doped semiconductor material 26 of wordline WL in the vertical cross-section. Third contact opening 56 and second contact opening(s) 54 are formed in a single masking step (e.g., using corresponding openings formed in photoimageable material 52) while elemental-form silicon of source/drain region 30 and/or 31 is completely covered in peripheral-circuitry region 14 in the vertical cross-section (e.g., by material(s) 42, 44, and/or 52). In one embodiment and as shown, a fourth contact opening 58 is also formed in the single masking step to conductive material (e.g., 36) of another peripheral transistor (e.g., PT2, and which in some embodiments may be considered as a fourth electronic component as referred to below and in the claims as-filed).

Figure 6:
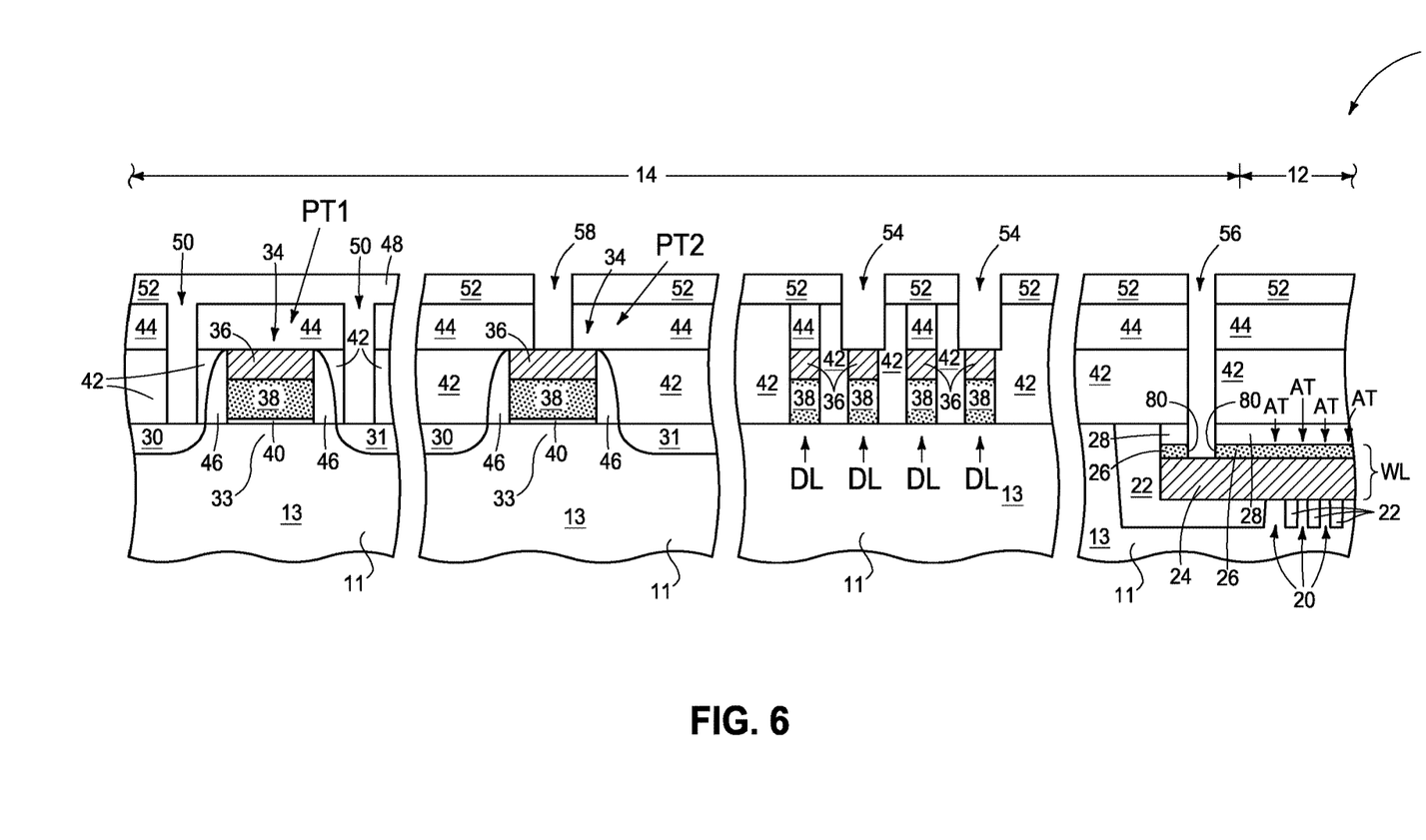
FIG. 6 is a view of the FIG. 5 construction at a processing step after that shown by FIG. 5.

Referring to FIG. 6, etching has been conducted through conductively-doped semiconductor material 26 to wordline-metal material 24 selectively relative to conductive material 36 of digitline(s) DL. Such has been conducted within third contact opening 56 and while second contact opening(s) 54 are outwardly exposed, and while elemental-form silicon of source/drain region 30 and/or 31 of peripheral transistor PT1 is completely covered in the vertical cross-section during such etching. An example technique includes dry anisotropic etching (e.g., using a Cl$_2$/N$_2$-mixture where material 26 comprises polysilicon). Contact opening 56 as extending through material 26 has sidewalls 80.

Figure 7:
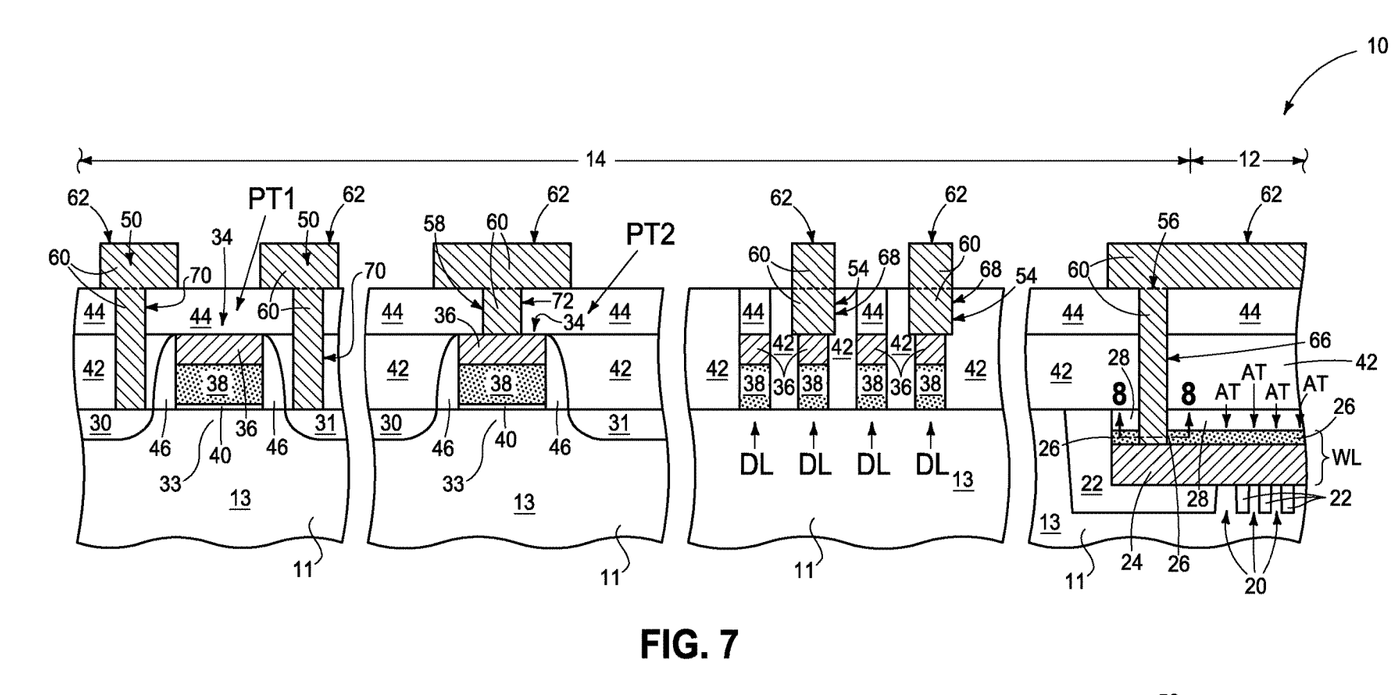
FIG. 7 is a view of the FIG. 5 construction at a processing step after that shown by FIG. 5
Figure 8:
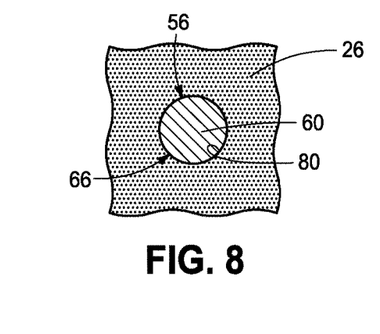
FIG. 8 is a view taken through line 8-8 in FIG. 7.
Figure 9:
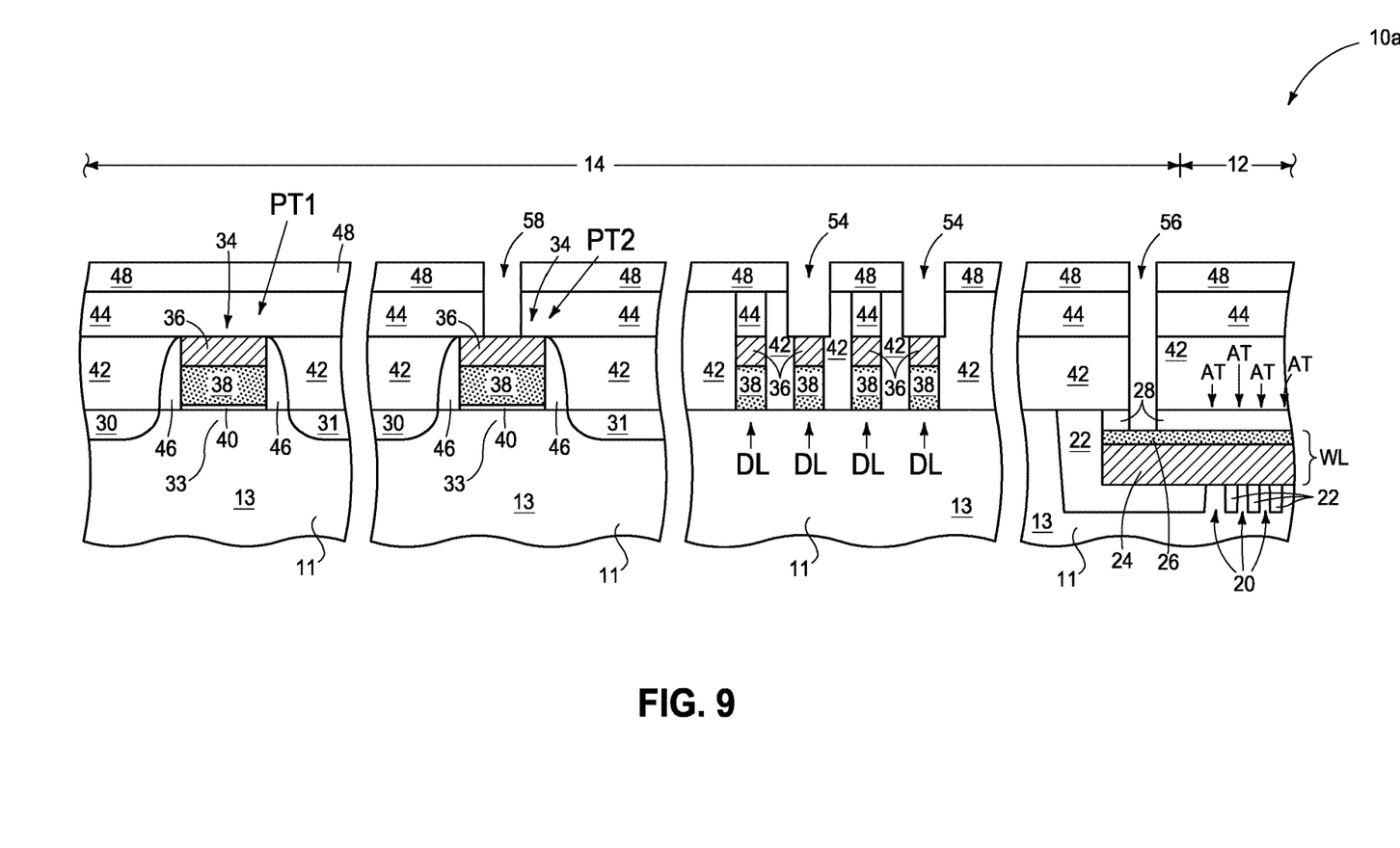
FIG. 9 is a diagrammatic and fragmentary cross-sectional view of a portion of a substrate construction in process in accordance with an embodiment of the invention.
Figure 10:
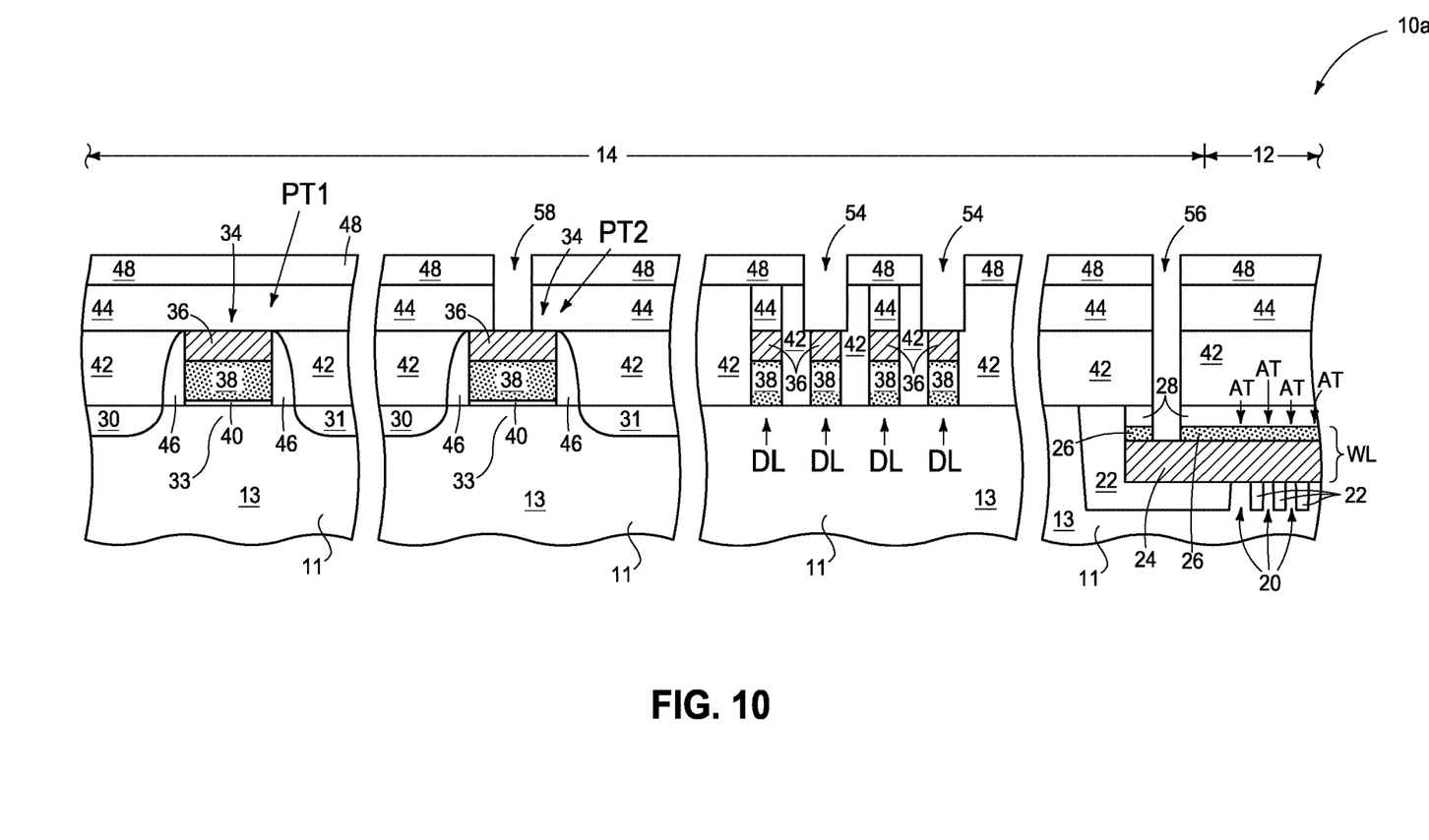
FIG. 10 is a view of the FIG. 9 construction at a processing step after that shown by FIG. 9.
Figure 11:
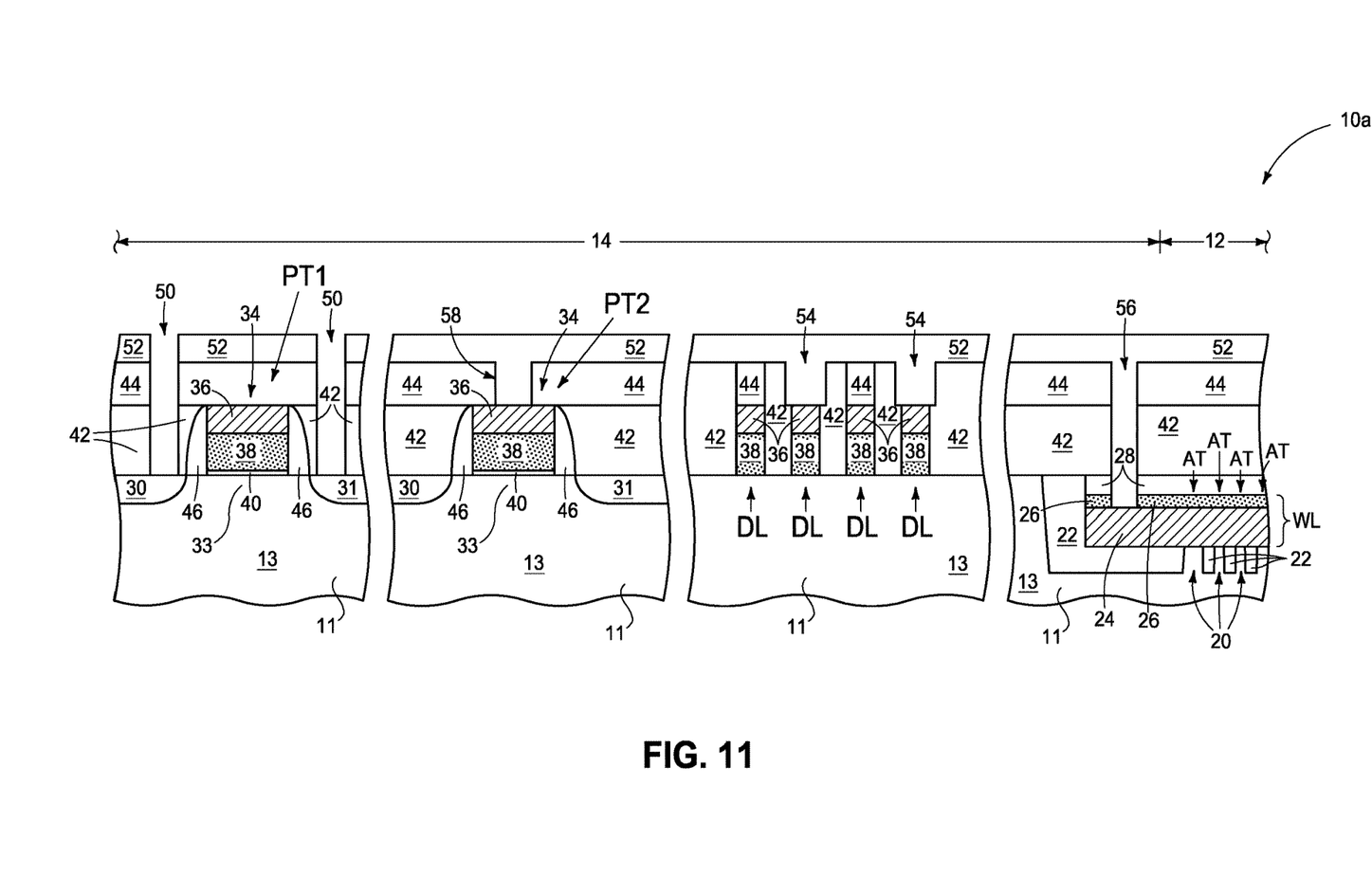
FIG. 11 is a view of the FIG. 10 construction at a processing step after that shown by FIG. 10.

Referring to FIGS. 7 and 8, and after masking material 52 (not shown) has been removed, conductive material 60 (e.g., metal material) has been formed within first contact opening(s) 50, second contact opening(s) 54, and third contact opening 56 (e.g., and within fourth contact opening 58). Conductive material 60 is also shown as having been formed atop insulative material 40 and as having been patterned into conductive line constructions 62. In some embodiments, material 60 within contact opening 56 may be considered as a wordline conductive via 66 (i.e., a conductive via extending to a wordline) or a first conductive via 66. In some embodiments, material 60 within contact opening 54 may be considered as a digitline conductive via 68 (i.e., a conductive via extending to a digitline) or a second conductive via 68. In some embodiments, material 60 within contact opening 50 may be considered as a first conductive via to a source/drain region. In some embodiments, material 60 within contact opening 58 may be considered as a second conductive via to a gate (e.g., a combination of materials 36 and 38).

Any other attribute(s) or aspect(s) as shown and/or described herein with respect to other embodiments may be used.

The above example processing described a method wherein first contact opening 50 was formed before forming second contact opening 54 and third contact opening 56. Alternately, second contact opening 54 (and third contact opening 56 and fourth contact opening 58) may be formed before forming first contact opening 50, for example as is shown with respect to a substrate construction 10a in FIGS. 9-11. Accordingly, reference to first, second, third, etc. with respect to contact openings is used to distinguish different contact openings from one another and not relative to time of fabrication unless otherwise specifically stated in a claim. In the processing-sequence of figures that is FIGS. 9-11, like numerals from the above-described embodiments have been used where appropriate, with some construction differences being indicated with the suffix "a". Any other attribute(s) or aspect(s) as shown and/or described herein with respect to other embodiments may be used.

Embodiments of the invention encompass a method used in forming integrated circuitry (e.g., regardless of whether being DRAM or other memory circuitry). Such a method comprises providing a substrate (e.g., 10, 10a) comprising a first electronic component (e.g., PT1, and regardless of whether a transistor), a second electronic component (e.g., PT2 or digitline DL, and regardless of whether being a transistor or a conductive line), and a third electronic component (e.g., wordline WL, and regardless of whether being a gate or a conductive line) that are laterally spaced from one another in a vertical cross-section (e.g., that of either FIG. 1 or 9). The first electronic component comprises a first outer region (e.g., 30 and/or 31, and regardless of whether part of a transistor) comprising elemental-form silicon. The second electronic component comprises a second outer region (e.g., 36) comprising metal material. The third electronic component comprises a third outer region (e.g., an upper portion of material 26) comprising elemental-form silicon (e.g., 26) directly above metal material (e.g., 24). Insulative material (e.g., 28, 42, and/or 44) is directly above the first, second, and third outer regions. In one embodiment, the elemental-form silicon of the first outer region is monocrystalline and the elemental-form silicon of the third outer region is polycrystalline.

In one embodiment, the insulative material that is directly above the second outer region predominately (herein meaning more than 50% up to and including 100% by volume) comprises a first composition (e.g., material 44 comprising silicon nitride) and the insulative material directly above the third outer region predominately comprises the first composition directly above and directly against a second composition (e.g., material 42 comprising silicon dioxide) that is different from the first composition. In one embodiment and as shown, the insulative material directly above the third outer region (e.g., 28/42/44) comprises the first composition (e.g., material 28 comprising silicon nitride) directly under and directly against the second composition (e.g., material 42 comprising silicon dioxide). In one such embodiment and as shown, the first composition that is directly under and directly against the second composition is directly against the elemental-form silicon of the third outer region. In one embodiment, all of metal materials 24 and 36 are of the same composition relative one another.

A first contact opening (e.g., 50 in either of FIG. 3 or 11) is formed through the insulative material (e.g., 44 and 42) to the elemental-form silicon of the first outer region in the vertical cross-section while the second and third outer regions are completely covered in the vertical cross-section. A second contact opening (e.g., 54 or 58 in FIG. 5 or 9) is formed through the insulative material to the metal material of the second outer region in the vertical cross-section and a third contact opening (e.g., 56) is formed through the insulative material to the elemental-form silicon of the third outer region in the vertical cross-section while the elemental-form silicon of the first outer region is completely covered in the vertical cross-section. Within the third contact opening and while the second contact opening is outwardly exposed, etching is conducted through the elemental-form silicon of the third outer region to the metal material of the third outer region selectively relative to the metal material of the second outer region. The elemental-form silicon of the first outer region is completely covered in the vertical cross-section during such etching. In one embodiment, during the forming of the first contact opening, at least some of the second and third outer regions are covered by a photoimageable material in the vertical cross-section. In one embodiment, during the forming of the second and third contact openings, at least some of the first outer region is covered by a photoimageable material in the vertical cross-section. In one embodiment and as shown, such etching is also conducted selectively relative to the metal material of the third outer region. After such etching, conductive material (e.g., 60) is formed within the first, second, and third contact openings Any other attribute(s) or aspect(s) as shown and/or described herein with respect to other embodiments may be used.

Embodiments of the invention encompass DRAM circuitry independent of method of manufacture. Nevertheless, such circuitry may be fabricated using any of the above techniques and may have any of the above-described attributes. Such circuitry comprises an array region (e.g., 12) comprising memory cells (e.g., MC) individually comprising an array transistor (e.g., AT) having a pair of source/drain regions (e.g., 16, 18) and a gate (e.g., 19) comprising a wordline (e.g., WL), a capacitor (e.g., C) electrically coupled to one of the source/drain regions (e.g., 16), and with the other of the source/drain regions (e.g., 18) being electrically coupled to a digitline (e.g., DL). The wordline comprises conductively-doped polysilicon directly above metal material. A peripheral-circuitry region (e.g., 14) is adjacent the array region and the wordline extends from the array region into the peripheral-circuitry region. In one embodiment, the digitline extends from the array region into the peripheral-circuitry region, and in one embodiment the peripheral-circuitry region comprises first and second peripheral transistors (e.g., PT1 and PT2).

A wordline conductive via (e.g., 66) is in the peripheral-circuitry region and extends through insulative material (e.g., 44, 42, and/or 28) that is directly above the conductively-doped polysilicon and extends through the conductively-doped polysilicon to metal material of the wordlines. In one embodiment, the wordline conductive via is directly against the conductively-doped polysilicon, and in one embodiment and as shown, is directly against sidewalls (e.g., 80) of the conductively-doped polysilicon. In one embodiment and as shown, the wordline conductive via is completely radially-encircled (e.g., FIG. 8) by the conductively-doped polysilicon, and in one such embodiment the conductively-doped polysilicon is directly against the wordline conductive via radially all about the wordline conductive via.

In one embodiment, a digitline conductive via (e.g., 68) in the peripheral-circuitry region extends to the digitline through insulative material that is directly above the digitline. A first conductive via (e.g., 70) in the peripheral-circuitry region extends to a source/drain region (e.g., 30 or 31) of the first peripheral transistor through insulative material that is directly above the source/drain region of the peripheral transistor. A second conductive via (e.g., 72) in the peripheral-circuitry region extends to a gate (e.g., 36/38) of the second peripheral transistor through insulative material that is directly above the gate.

Any other attribute(s) or aspect(s) as shown and/or described herein with respect to other embodiments may be used. Any other attribute may apply.

Embodiments of the invention encompass integrated circuitry independent of method of manufacture and independent of whether comprising DRAM or other memory circuitry. Nevertheless, such circuitry may be fabricated using any of the above techniques and may have any of the above-described attributes. Such circuitry comprises a first conductive line (e.g., wordline WL but regardless of whether such is a wordline or other conductive gate line) buried within semiconductive material (e.g., 13) of a substrate (e.g., 11). The first conductive line comprises conductively-doped semiconductor material (e.g., 26) directly above and directly against metal material (e.g., 24) in a vertical cross-section (e.g., that of FIG. 7). A second conductive line (e.g., DL and regardless of whether such is a digitline) is above the semiconductive material and is laterally-spaced from the first conductive line in the vertical cross-section. The second conductive line comprises metal material (e.g., 36) in the vertical cross-section. Insulative material (e.g., 44) is directly above the first and second conductive lines. A first conductive via (e.g., 66) extends through the insulative material and through the conductively-doped semiconductor material to the metal material of the first conductive line. A second conductive via (e.g., 68) extends through the insulative material to the metal material of the second conductive line.

In one embodiment, the first conductive via is directly against the conductively-doped semiconductor material, and in one such embodiment is directly against sidewalls (e.g., 80) of the conductively-doped semiconductor material. In one embodiment, the first conductive via is completely radially-encircled by the conductively-doped semiconductor material, and in one such embodiment is directly against the first conductive via radially all about the first conductive via. In one embodiment, the conductively-doped semiconductor material comprises polysilicon, and in one such embodiment the first conductive line is a wordline of memory circuitry (e.g., DRAM circuitry).

Any other attribute(s) or aspect(s) as shown and/or described herein with respect to other embodiments may be used. Any other attribute may apply.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, a selective etch or removal is an etch or removal where one material is removed relative to another stated material at a rate of at least 1.5:1.

CONCLUSION

In some embodiments, a method used in forming integrated circuitry comprises providing a substrate comprising first, second, and third electronic components that are laterally spaced from one another in a vertical cross-section. The first electronic component comprises a first outer region comprising elemental-form silicon. The second electronic component comprises a second outer region comprising metal material. The third electronic component comprises a third outer region comprising elemental-form silicon directly above metal material. Insulative material is directly above the first, second, and third outer regions. A first contact opening if formed through the insulative material to the elemental-form silicon of the first outer region in the vertical cross-section while the second and third outer regions are completely covered in the vertical cross-section. A second contact opening is formed through the insulative material to the metal material of the second outer region in the vertical cross-section and a third contact opening is formed through the insulative material to the elemental-form silicon of the third outer region in the vertical cross-section while the elemental-form silicon of the first outer region is completely covered in the vertical cross-section. Within the third contact opening and while the second contact opening is outwardly exposed, etching is conducted through the elemental-form silicon of the third outer region to the metal material of the third outer region selectively relative to the metal material of the second outer region. The elemental-form silicon of the first outer region is completely covered in the vertical cross-section during said etching. After said etching, conductive material is formed in the first, second, and third contact openings.

In some embodiments, a method used in forming integrated circuitry comprising DRAM comprises providing a substrate comprising an array region comprising memory cells individually comprising an array transistor having a pair of source/drain regions and a gate comprising a wordline, a capacitor electrically coupled to one of the source/drain regions, and the other of the source/drain regions electrically coupled to a digitline. The wordline comprises conductively-doped polysilicon directly above and directly against metal material. A peripheral-circuitry region is provided adjacent the array region. The peripheral-circuitry region comprises a peripheral transistor. The wordline and the digitline extend from the array region into the peripheral-circuitry region. Insulative material is directly above the wordline, the digitline, and the peripheral transistor in the peripheral-circuitry region. A first contact opening is formed through the insulative material in the peripheral-circuitry region to elemental-form silicon of a source/drain region of the peripheral transistor in a vertical cross-section while the wordline and the digitline are completely covered in the peripheral-circuitry region in the vertical cross-section. In a single masking step, a second contact opening is formed through the insulative material in the peripheral-circuitry region to conductive material of the digitline in the vertical cross-section and a third contact opening is formed through the insulative material in the peripheral-circuitry region to the conductively-doped poly silicon of the wordline in the vertical cross-section while the elemental-form silicon of the source/drain region of the peripheral transistor is completely covered in the peripheral-circuitry region in the vertical cross-section. Within the third contact opening and while the second contact opening is outwardly exposed, etching is conducted through the conductively-doped polysilicon to the wordline-metal material selectively relative to the conductive material of the digitline. The elemental-form silicon of the source/drain region of the peripheral transistor is completely covered in the vertical cross-section during said etching. After said etching, conductive material is formed in the first, second, and third contact openings.

In some embodiments, DRAM circuitry comprises an array region comprising memory cells individually comprising an array transistor having a pair of source/drain regions and a gate comprising a wordline, a capacitor electrically coupled to one of the source/drain regions, and the other of the source/drain regions electrically coupled to a digitline. The wordline comprises conductively-doped polysilicon directly above metal material. A peripheral-circuitry region is adjacent the array region. The wordline extends from the array region into the peripheral-circuitry region. A wordline conductive via is in the peripheral-circuitry region and extends through insulative material that is directly above the conductively-doped polysilicon and extends through the conductively-doped polysilicon to the metal material of the wordlines.

In some embodiments, DRAM circuitry comprises an array region comprising memory cells individually comprising an array transistor having a pair of source/drain regions and a gate comprising a wordline, a capacitor electrically coupled to one of the source/drain regions, and the other of the source/drain regions electrically coupled to a digitline. The wordline comprises conductively-doped polysilicon directly above metal material. A peripheral-circuitry region is adjacent the array region. The peripheral-circuitry region comprises first and second peripheral transistors. The wordline and the digitline extend from the array region into the peripheral-circuitry region. A wordline conductive via is in the peripheral-circuitry region and extends through insulative material that is directly above the conductively-doped polysilicon and extends through the conductively-doped polysilicon to the metal material of the wordlines. A digitline conductive via is in the peripheral-circuitry region and extends to the digitline through insulative material that is directly above the digitline. A first conductive via is in the peripheral-circuitry region and extends to a source/drain region of the first peripheral transistor through insulative material that is directly above the source/drain region of the peripheral transistor. A second conductive via in the peripheral-circuitry region extends to a gate of the second peripheral transistor through insulative material that is directly above the gate.

In some embodiments, integrated circuitry comprises a first conductive line buried within semiconductive material of a substrate. The first conductive line comprises conductively-doped semiconductor material directly above and directly against metal material in a vertical cross-section. A second conductive line is above the semiconductive material and laterally-spaced from the first conductive line in the vertical cross-section. The second conductive line comprises metal material in the vertical cross-section. Insulative material is directly above the first and second conductive lines. A first conductive via extends through the insulative material and through the conductively-doped semiconductor material to the metal material of the first conductive line. A second conductive via extends through the insulative material to the metal material of the second conductive line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
   providing a substrate comprising first, second, and third electronic components that are laterally spaced from one another in a vertical cross-section; the first electronic component comprising a first outer region comprising elemental-form silicon; the second electronic component comprising a second outer region comprising metal material; the third electronic component comprising a third outer region comprising elemental-form silicon directly above metal material; insulative material being directly above the first, second, and third outer regions;
   forming a first contact opening through the insulative material to the elemental-form silicon of the first outer region in the vertical cross-section while the second and third outer regions are completely covered with masking material in the vertical cross-section;
   forming a second contact opening through the insulative material to the metal material of the second outer region in the vertical cross-section and a third contact opening through the insulative material to the elemental-form silicon of the third outer region in the vertical cross-section while the elemental-form silicon of the first outer region is completely covered with masking material in the vertical cross-section;
   within the third contact opening and while the second contact opening is outwardly exposed, etching through the elemental-form silicon of the third outer region to the metal material of the third outer region selectively relative to the metal material of the second outer region; the elemental-form silicon of the first outer region being completely covered with masking material in the vertical cross-section during said etching; and
   after said etching, forming conductive material in the first, second, and third contact openings.

2. The method of claim 1 wherein the first contact opening is formed before forming the second and third contact openings.

3. The method of claim 1 wherein the second and third contact openings are formed before forming the first contact opening.

4. The method of claim 1 wherein the second and third contact openings are formed together using a single masking step.

5. The method of claim 4 comprising forming a fourth contact opening to a fourth electronic component in the single masking step.

6. The method of claim 1 wherein the insulative material directly above the second outer region predominately comprises a first composition and the insulative material directly above the third outer region predominately comprises the first composition directly above and directly against a second composition that is different from the first composition.

7. The method of claim 6 wherein the first composition is silicon nitride and the second composition is silicon dioxide.

8. The method of claim 6 wherein the insulative material directly above the third outer region comprises the first composition directly under and directly against the second composition.

9. The method of claim 8 wherein the first composition that is directly under and directly against the second composition is directly against the elemental-form silicon of the third outer region.

10. The method of claim 1 wherein the elemental-form silicon of the first outer region is monocrystalline, and the elemental-form silicon of the third outer region is polycrystalline.

11. The method of claim 1 wherein all said metal materials are of the same composition relative one another.

12. The method of claim 1 wherein said etching is conducted selectively relative to the metal material of the third outer region.

13. The method of claim 1 wherein during the forming of the first contact opening, at least some of the second and third outer regions are covered by a photoimageable material in the vertical cross-section.

14. The method of claim 1 wherein during the forming of the second and third contact openings, at least some of the first outer region is covered by a photoimageable material in the vertical cross-section.

15. The method of claim 1 wherein each of,
   (a) the masking material completely covering the second and third outer regions in the vertical cross-section during the forming of the first contact opening,
   (b) the masking material completely covering the elemental-form silicon of the first outer region in the vertical cross-section during the forming of the second contact opening, and
   (c) the masking material completely covering the elemental-form silicon of the first outer region during said etching
   comprises a photoimageable material.

16. The method of claim 15 wherein the photoimageable material of each of the (a), (b), and (c) are of the same composition relative one another.

17. The method of claim 15 wherein the photoimageable material of each of the (a), (b), and (c) comprises photoresist.

18. The method of claim 15 comprising ultimately removing all of the photoimageable material of each of the (a), (b), and (c) from the substrate.

19. A method used in forming integrated circuitry comprising DRAM, comprising:
   providing a substrate comprising an array region comprising memory cells individually comprising an array transistor having a pair of source/drain regions and a gate comprising a wordline, a capacitor electrically coupled to one of the source/drain regions, and the other of the source/drain regions electrically coupled to a digitline; the wordline comprising conductively-doped polysilicon directly above and directly against metal material;
   providing a peripheral-circuitry region adjacent the array region, the peripheral-circuitry region comprising a peripheral transistor, the wordline and the digitline extending from the array region into the peripheral-circuitry region, insulative material being directly above the wordline, the digitline, and the peripheral transistor in the peripheral-circuitry region;

forming a first contact opening through the insulative material in the peripheral-circuitry region to elemental-form silicon of a source/drain region of the peripheral transistor in a vertical cross-section while the wordline and the digitline are completely covered with masking material in the peripheral-circuitry region in the vertical cross-section;

in a single masking step, forming a second contact opening through the insulative material in the peripheral-circuitry region to conductive material of the digitline in the vertical cross-section and a third contact opening through the insulative material in the peripheral-circuitry region to the conductively-doped polysilicon of the wordline in the vertical cross-section while the elemental-form silicon of the source/drain region of the peripheral transistor is completely covered with masking material in the peripheral-circuitry region in the vertical cross-section;

within the third contact opening and while the second contact opening is outwardly exposed, etching through the conductively-doped polysilicon to the wordline-metal material selectively relative to the conductive material of the digitline; the elemental-form silicon of the source/drain region of the peripheral transistor being completely covered with masking material in the vertical cross-section during said etching; and after said etching, forming conductive material in the first, second, and third contact openings.

20. The method of claim 19 wherein each of,
(a) the masking material completely covering the wordline and the digitline in the vertical cross-section during the forming of the first contact opening,
(b) the masking material completely covering the elemental-form silicon of the source/drain region of the peripheral transistor in the peripheral-circuitry region in the vertical cross-section during the forming of the second contact opening, and
(c) the masking material completely covering the elemental-form silicon of the source/drain region of the peripheral transistor during said etching
comprises a photoimageable material.

21. The method of claim 20 wherein the photoimageable material of each of the (a), (b), and (c) are of the same composition relative one another.

22. The method of claim 20 wherein the photoimageable material of each of the (a), (b), and (c) comprises photoresist.

23. The method of claim 20 comprising ultimately removing all of the photoimageable material of each of the (a), (b), and (c) from the substrate.

* * * * *